US012604756B2

(12) United States Patent
Matsubara et al.

(10) Patent No.: US 12,604,756 B2
(45) Date of Patent: Apr. 14, 2026

(54) METHOD FOR MANUFACTURING SEMICONDUCTOR DEVICE

(71) Applicant: Resonac Corporation, Tokyo (JP)

(72) Inventors: Hiroaki Matsubara, Tokyo (JP); Daisuke Ikeda, Tokyo (JP); Keisuke Okawara, Tokyo (JP); Shogo Sobue, Tokyo (JP); Saeko Ogawa, Tokyo (JP)

( * ) Notice: Subject to any disclaimer, the term of this patent is extended or adjusted under 35 U.S.C. 154(b) by 306 days.

(21) Appl. No.: 18/255,382

(22) PCT Filed: Dec. 2, 2021

(86) PCT No.: PCT/JP2021/044321
§ 371 (c)(1),
(2) Date: Jun. 1, 2023

(87) PCT Pub. No.: WO2022/118929
PCT Pub. Date: Jun. 9, 2022

(65) Prior Publication Data
US 2024/0030183 A1 Jan. 25, 2024

(30) Foreign Application Priority Data

Dec. 4, 2020 (WO) .................. PCT/JP2020/045335

(51) Int. Cl.
*H01L 23/00* (2006.01)
*H01L 21/56* (2006.01)
*H01L 23/31* (2006.01)

(52) U.S. Cl.
CPC ............ *H01L 24/96* (2013.01); *H01L 21/561* (2013.01); *H01L 21/568* (2013.01);
(Continued)

(58) Field of Classification Search
CPC ...................................................... H01L 24/96
See application file for complete search history.

(56) References Cited

U.S. PATENT DOCUMENTS 10,510,713 B1 * 12/2019 Chen ................... H01L 25/0652
2021/0082870 A1 * 3/2021 Wu ....................... H01L 21/561

FOREIGN PATENT DOCUMENTS

JP 2003-306653 10/2003
JP 2006-222164 8/2006
(Continued)

OTHER PUBLICATIONS

International Preliminary Report on Patentability with Written Opinion dated Jun. 15, 2023 for PCT/JP2020/045335.
(Continued)

*Primary Examiner* — Douglas M Menz
(74) *Attorney, Agent, or Firm* — SHIPWAY IP

(57) ABSTRACT

A method for manufacturing a semiconductor device includes preparing a plurality of semiconductor elements each including a first surface on which a connection terminal is formed and a second surface on a side opposite to the first surface, preparing a support member in which a curable bonding adhesive layer is formed on a carrier, attaching the plurality of semiconductor elements to the support member such that the second surface of each of the plurality of semiconductor elements is directed toward the curable bonding adhesive layer, fixing the plurality of semiconductor elements to the support member by curing the curable bonding adhesive layer, encapsulating the plurality of semiconductor elements with an encapsulant material, and removing the carrier.

19 Claims, 10 Drawing Sheets

(52) U.S. Cl.
CPC ...... *H01L 23/3128* (2013.01); *H01L 23/3135* (2013.01); *H01L 24/16* (2013.01); *H01L 24/97* (2013.01); *H01L 2224/16225* (2013.01); *H01L 2224/95001* (2013.01); *H01L 2224/96* (2013.01); *H01L 2224/97* (2013.01); *H01L 2924/15165* (2013.01); *H01L 2924/15311* (2013.01)

(56)                References Cited

FOREIGN PATENT DOCUMENTS

| | | |
|---|---|---|
| JP | 2010-034217 | 2/2010 |
| JP | 2013-168594 | 8/2013 |
| JP | 2017-050464 | 3/2017 |
| JP | 2017-228645 | 12/2017 |
| JP | 2018-009138 | 1/2018 |
| JP | 2019-129179 | 8/2019 |
| JP | 2019-211218 | 12/2019 |
| JP | 7226664 | 2/2023 |
| TW | 201839868 | 11/2018 |
| TW | 202033714 | 9/2020 |
| WO | 2017/149810 | 9/2017 |

OTHER PUBLICATIONS

International Preliminary Report on Patentability with Written Opinion dated Jun. 15, 2023 for PCT/JP2021/044321.
International Search Report dated Mar. 2, 2021 for PCT/JP2020/045335.
International Search Report dated Feb. 15, 2022 for PCT/JP2021/044321.

* cited by examiner

METHOD FOR MANUFACTURING SEMICONDUCTOR DEVICE

CROSS-REFERENCE TO RELATED APPLICATIONS

This application is a 35 U.S.C. § 371 national phase application of PCT/JP2021/044321, filed on Dec. 2, 2021, which claims priority to International Patent Application No. PCT/JP2020/045335, filed on Dec. 4, 2020.

TECHNICAL FIELD

The present disclosure relates to a method for manufacturing a semiconductor device.

BACKGROUND ART

In Patent Literature 1, a thermally peelable adhesive sheet used for manufacturing a semiconductor device is disclosed.

CITATION LIST

Patent Literature

Patent Literature 1: Japanese Unexamined Patent Publication No. 2003-306653

SUMMARY OF INVENTION

Technical Problem

As one method for manufacturing a semiconductor device, a fan-out package is known. In the fan-out package, singulated semiconductor chips (dies) are arranged on a different wafer(s) and encapsulated to be a redisposition wafer, and then, a re-distribution layer (RDL) is formed, and each semiconductor device is manufactured. In such a fan-out package method, for example, as illustrated in FIGS. 5A-5E, when semiconductor elements 10 are redisposed on a carrier 120, the semiconductor elements 10 are disposed first on an adhesive layer 122 of the carrier 120 (for example, refer to Patent Literature 1). However, the adhesive layer 122 temporary fixes the semiconductor elements 10 and does not rigidly fix the semiconductor elements 10 onto the carrier 120, and thus the semiconductor elements may be displaced when the semiconductor elements are encapsulated with an encapsulant material.

An object of the present disclosure is to provide a manufacturing method for reducing the displacement of a semiconductor element.

Solution to Problem

As one aspect, the present disclosure relates to a method for manufacturing a semiconductor device. The method for manufacturing a semiconductor device includes preparing a plurality of semiconductor elements each including a first surface on which a connection terminal is formed and a second surface on a side opposite to the first surface, preparing a support member in which a curable bonding adhesive layer is formed on a carrier, attaching the plurality of semiconductor elements to the support member such that the second surface of each of the plurality of semiconductor elements is directed toward the curable bonding adhesive layer, fixing the plurality of semiconductor elements to the support member by curing the curable bonding adhesive layer, encapsulating the plurality of semiconductor elements with an encapsulant material, and removing the carrier.

In this method, the curable bonding adhesive layer is used as a layer for attaching the plurality of semiconductor elements onto the carrier, and the plurality of semiconductor elements are fixed to the support member by curing the curable bonding adhesive layer. In this case, the plurality of semiconductor elements are fixed onto the carrier by the cured curable bonding adhesive layer, and thus it is possible to reduce the displacement of the semiconductor element.

In the manufacturing method described above, a bonding adhesive strength between the cured curable bonding adhesive layer and the encapsulant material may be 4.0 MPa or more. In this case, it is possible to keep the bonding adhesive strength between the curable bonding adhesive layer and the encapsulant material strong, to prevent peeling after package assembly, and to allow the curable bonding adhesive layer to function as it is as a part of the final product of the semiconductor device. In this case, the bonding adhesive strength between the cured curable bonding adhesive layer and the encapsulant material may be 8.0 MPa or less. The bonding adhesive strength between the cured curable bonding adhesive layer and the encapsulant material may be 20 MPa or more. In this case, it is possible to keep the bonding adhesive strength between the curable bonding adhesive layer and the encapsulant material stronger, to prevent the peeling after the package assembly, and to allow the curable bonding adhesive layer to function as it is as a part of the final product of the semiconductor device.

In the manufacturing method described above, a bonding adhesive strength between the cured curable bonding adhesive layer and the plurality of semiconductor elements may be 4.0 MPa or more. In this case, it is possible to keep the bonding adhesive strength between the curable bonding adhesive layer and the plurality of semiconductor elements (for example, silicon chips) strong, to prevent the peeling after the package assembly, and to allow the curable bonding adhesive layer to function as it is as a part of the final product of the semiconductor device.

In the manufacturing method described above, the semiconductor device in a state in which the cured curable bonding adhesive layer protects the second surface of each of the plurality of semiconductor elements may be acquired. In this case, it is possible to allow the curable bonding adhesive layer to function as it is as a part of the final product of the semiconductor device.

In the manufacturing method described above, the carrier may be a glass substrate, and a bonding adhesive strength of the curable bonding adhesive layer to the glass substrate may be 1 MPa or more when the curable bonding adhesive layer is cured, and may be 5 MPa or less when the curable bonding adhesive layer is irradiated with laser. By setting the bonding adhesive strength of the curable bonding adhesive layer to the glass substrate to 1 MPa or more when the curable bonding adhesive layer is cured, it is possible to more rigidly fix the semiconductor element to the support member, and to further reduce the displacement of the semiconductor element. In addition, by setting the bonding adhesive strength of the curable bonding adhesive layer to the glass substrate to 5 MPa or less when the curable bonding adhesive layer is irradiated with the laser, it is possible to simply remove the carrier by laser irradiation when removing the carrier, and to improve a working efficiency.

In the manufacturing method described above, the curable bonding adhesive layer may include a resin composition containing a thermoplastic resin and an epoxy curing agent, and a glass transition temperature of the thermoplastic resin may be −40° C. or higher and 40° C. or lower. In this case, it is possible to reduce warpage after package completion. The curable bonding adhesive layer may include a light absorbing agent, or may include optical absorption properties. The light absorbing agent or the optical absorption properties, for example, may absorb light at 193 nm or more and 351 nm or less, which are wavelength bands of excimer laser that is one type of UV laser. Examples of the excimer laser may include XeF excimer laser (a wavelength of 351 nm), XeCl excimer laser (a wavelength of 303 nm), KrF excimer laser (a wavelength of 248 nm), ArF excimer laser (a wavelength of 193 nm), and the like. In addition, YAG laser (a triple wave) (a wavelength of 355 nm), YAG laser (a quadruple wave) (a wavelength of 266 nm), and the like, which are other UV laser beams, may be used.

In the manufacturing method described above, in the removing of the carrier, the carrier may be removed by applying laser light such that peeling energy for peeling off the carrier is 1 kW/cm² or more and 200 kW/cm² or less. In this case, the carrier can be removed with low energy, and thus it is possible to minimally suppress a heat damage to the semiconductor element or the like, and to minimally suppress the dust generated after the laser irradiation. In addition, the laser to be applied has low energy, and thus it is possible to shorten the time required for removing the carrier. A laser type used for the peeling is not limited.

In the manufacturing method described above, a thickness of the curable bonding adhesive layer may be 1 μm or more and 400 μm or less after curing. In this case, it is possible to further reduce the displacement of the semiconductor element by more reliably retaining the plurality of semiconductor elements with the cured curable bonding adhesive layer. In addition, by setting the thickness to 400 μm or less, it is possible to reduce the height of the semiconductor device to be manufactured.

In the manufacturing method described above, it is preferable that the carrier is a glass substrate or a transparent resin substrate, and a thickness thereof is 0.1 mm or more and 2.0 mm or less. In this case, in the state of suppressing the displacement of the plurality of semiconductor elements or the like retained by the carrier, for example, it is possible to perform grinding of the encapsulant material, forming of a re-distribution layer, or the like, and to prepare the semiconductor device of which the height is further reduced with an excellent accuracy.

The manufacturing method described above may further include grinding an encapsulant material layer encapsulating the plurality of semiconductor elements fixed to the support member in a state in which the plurality of semiconductor elements are fixed to the support member. In this case, it is not necessary to separately provide a protective film for a semiconductor element using a fan-out method of the related art, and it is possible to use the carrier, which is attached by the curable bonding adhesive layer from the beginning, as it is as the protective film in each step. Accordingly, it is possible to simplify a manufacturing step or to reduce a manufacturing cost, compared to the case of separately using the protective film. In addition, the carrier is used as it is from the beginning, and thus it is also possible to further reduce the displacement of the plurality of semiconductor elements, compared to the case of separately attaching the protective film in the middle.

The manufacturing method described above may further include forming a re-distribution layer on the first surface of the plurality of semiconductor elements fixed to the support member in a state in which the plurality of semiconductor elements are fixed to the support member. In the fan-out method of the related art, the semiconductor element is attached to the carrier by the adhesive layer, or the rigid carrier is removed in the middle and the encapsulant material is ground, and thus the flatness of the surface of the encapsulant material and the semiconductor element encapsulated with the encapsulant material is degraded, and it is difficult to form a fine re-distribution layer. In contrast, according to this manufacturing method, the plurality of semiconductor elements are encapsulated with the encapsulant material in a state where the plurality of semiconductor elements are attached onto the carrier, and thus it is possible to increase the flatness of the surface of the encapsulant material and the semiconductor element encapsulated with the encapsulant material. Therefore, according to this manufacturing method, it is possible to easily form a fine re-distribution layer.

The manufacturing method described above may further include attaching a solder ball to the connection terminal of the plurality of semiconductor elements or the re-distribution layer in a state in which the plurality of semiconductor elements are fixed to the support member. In this case, the solder ball is attached to the semiconductor element or the re-distribution layer attached onto the carrier without any displacement, it is possible to attach the solder ball with an excellent accuracy.

In the manufacturing method described above, it is preferable that the carrier is a light transmissive substrate, and the curable bonding adhesive layer includes a light absorbing agent, and in the removing of the carrier, the carrier is removed by irradiating the cured curable bonding adhesive layer with laser light from the carrier side. In this case, it is possible to simplify the work of removing the carrier. In addition, according to such a laser light treatment, it is also possible to increase the flatness or the cleanliness of the surface from which the carrier is removed.

In the manufacturing method described above, in the removing of the carrier, the carrier may be removed by scraping or melting the carrier.

The manufacturing method described above may further include cleaning an exposed surface of either the cured curable bonding adhesive layer or the encapsulant material layer of the encapsulant material after the removing of the carrier. In this case, it is possible to make the surface of the semiconductor device to be manufactured cleaner to have excellent visual quality.

The manufacturing method described above may further include singulating the plurality of semiconductor elements after the removing of the carrier. In this case, various steps are performed while the plurality of semiconductor elements are retained on the carrier until the plurality of semiconductor elements are singulated into each of the semiconductor devices including the semiconductor element, and thus it is not necessary to use various protective layers (backside coat and the like) used in the related art, and it is possible to reduce the manufacturing step or to reduce the manufacturing cost. In this case, in the singulating of the plurality of semiconductor elements, the cured curable bonding adhesive layer may be singulated together with the plurality of semiconductor elements, and the semiconductor device may be acquired from each of the plurality of semiconductor elements in which the second surface is protected with the curable bonding adhesive layer.

In the manufacturing method described above, in the attaching of the plurality of semiconductor elements, a plurality of electronic components may be attached to the support member together with the plurality of semiconductor elements, and in the fixing of the plurality of semiconductor elements, the plurality of electronic components may be fixed to the support member by curing the curable bonding adhesive layer. In this case, it is also possible to attach the electronic component with an excellent position accuracy, and to prepare a more complicated semiconductor device by a simple method.

Advantageous Effects of Invention

According to one aspect of the present disclosure, it is possible to reduce a displacement of a semiconductor element in manufacturing of a semiconductor device.

DESCRIPTION OF EMBODIMENTS

Figure 1:
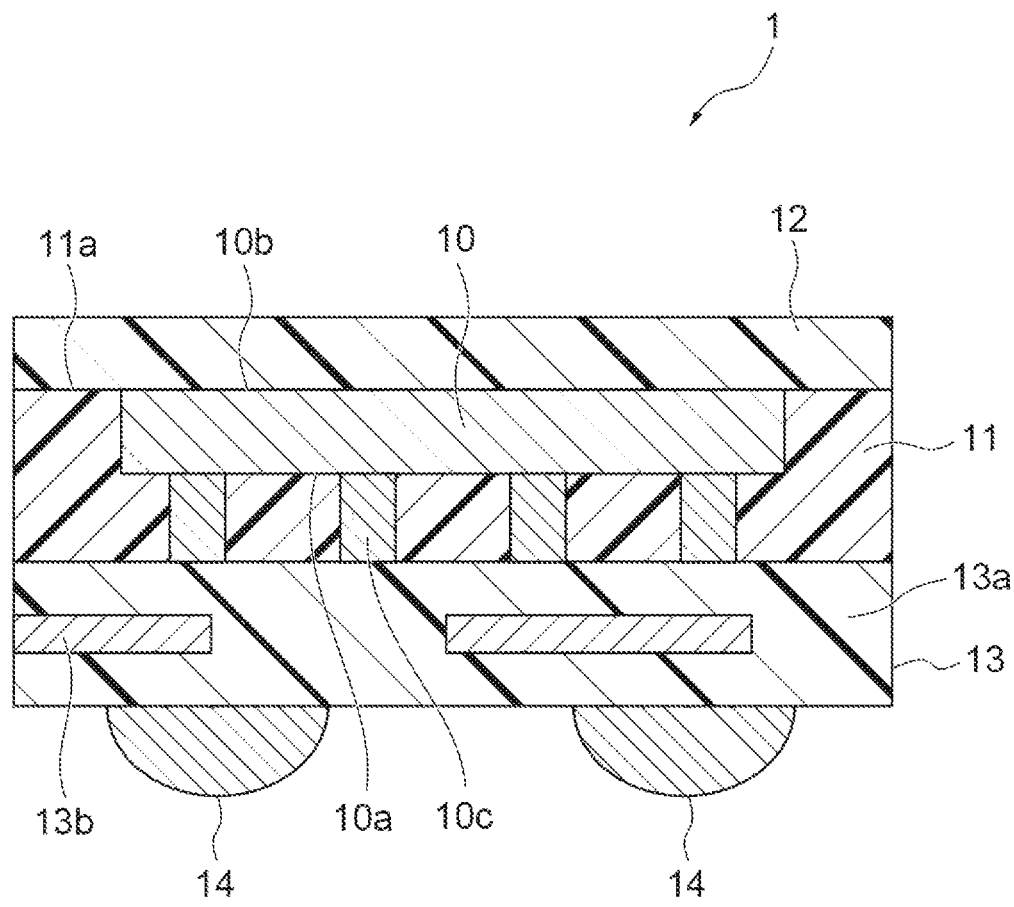
FIG. 1 is a sectional view illustrating an example of a semiconductor device to be manufactured by a method according to one embodiment of the present disclosure.

Hereinafter, several embodiments of the present disclosure will be described in detail, with reference to the drawings, as necessary. However, the present disclosure is not limited to the following embodiments. In the following description, the same reference numerals will be applied to the same or corresponding parts, and the repeated description will be omitted. A positional relationship such as the left, right, top, and bottom is based on a positional relationship illustrated in the drawings, unless otherwise specified. A dimension ratio in the drawings is not limited to the illustrated ratio.

In this specification, the term "layer" includes not only a structure in which a layer is formed on the entire surface but also a structure in which a layer is formed on a part of the surface when observed as a plan view. In this specification, the term "step" includes not only an independent step but also a step that is not explicitly distinguishable from other steps insofar as a desired function of the step is attained.

In this specification, a numerical range represented by using "to" indicates a range including numerical values described before and after "to" as the minimum value and the maximum value, respectively. In a numerical range described in a stepwise manner in this specification, the upper limit value or the lower limit value of the numerical range in a certain step may be replaced with the upper limit value or the lower limit value of the numerical range in another step. In the numerical range described in this specification, the upper limit value or the lower limit value of the numerical range may be replaced with a value described in Examples.

(Configuration of Semiconductor Device)

FIG. 1 is a sectional view schematically illustrating an example of a semiconductor device to be manufactured by a manufacturing method according to this embodiment. As illustrated in FIG. 1, a semiconductor device 1, for example, is a device having a fan-out structure, and includes a semiconductor element 10, an encapsulant material layer 11, a protective layer 12, a re-distribution layer 13, and solder balls 14. The semiconductor device 1, for example, is prepared by a fan-out package (FO-PKG) technology, and for example, may be prepared by a fan-out wafer level package (FO-WLP) technology or may be prepared by a fan-out panel level package (FO-PLP) technology. The encapsulant material layer 11 is a layer in which the semiconductor element 10 is encapsulated with an encapsulant material such as a resin. The protective layer 12 is a layer protecting the semiconductor element 10, and is a cured layer disposed on a second surface 10*b* of the semiconductor element 10 and a surface 11*a* of the encapsulant material layer 11. The protective layer 12 is formed by curing a curable bonding adhesive layer 22 described below (refer to FIGS. 2A to 2D). The protective layer 12 is fixed to the second surface 10*b* of the semiconductor element 10 and the encapsulant material layer 11 such that peeling does not occur, and a bonding adhesive strength between the second surface 10*b* of the semiconductor element 10 and the surface 11*a* of the encapsulant material layer 11, and the protective layer 12, for example, may be 4.0 MPa or more. The re-distribution layer 13 is a layer widening a terminal pitch of a connection terminal 10*c* on a first surface 10*a* side of the semiconductor element 10, and for example, includes an insulating portion 13*a* such as polyimide and a wiring portion 13*b* such as copper wiring. Each solder ball 14 is connected to the terminal of which the terminal pitch is widened by the re-distribution layer 13 such that the connection terminal 10*c* of the semiconductor element 10 is pitch-converted (widened) and connected to the solder ball 14.

(Method for Manufacturing Semiconductor Device)

Next, a method for manufacturing the semiconductor device 1 will be described with reference to FIGS. 2A-2D to FIGS. 4A-4D. FIGS. 2A-2D to FIGS. 4A-4D are diagrams sequentially illustrating the method for manufacturing the semiconductor device 1. In the method for manufacturing a semiconductor device, first, a plurality of semiconductor elements 10 each including the first surface 10*a* on which the connection terminals 10*c* are formed and the second surface 10*b* on a side opposite to the first surface 10*a* are prepared (refer to FIG. 1 and FIG. 2B). The plurality of semiconductor elements 10, for example, are collectively formed by a general semiconductor process, and then, are singulated by dicing, and each of the semiconductor elements 10 is prepared. Since a method of the related art can be used in this preparing step, the description will be omitted.

Figure 2A:
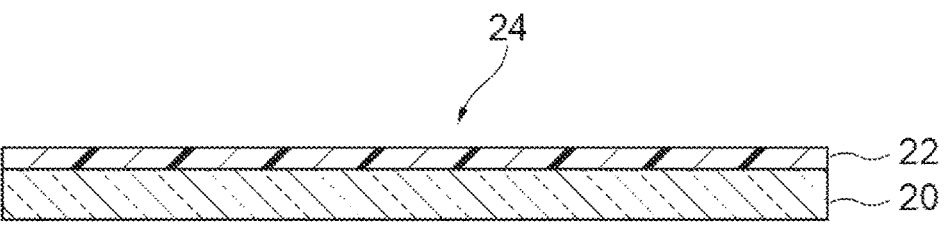
FIGS. 2A to 2D are diagrams illustrating a part of the method for manufacturing the semiconductor device illustrated in FIG. 1.

As illustrated in FIG. 2A, the curable bonding adhesive layer 22 is formed on a carrier 20 having light transmissivity, such as a glass substrate, to form (prepare) a support member 24 for supporting the plurality of semiconductor elements 10. In this manufacturing method, various steps are performed on the carrier 20 until the semiconductor element 10 attached onto a die redisposition body is singulated again, and thus the thickness of the carrier 20, for example, is 0.1 mm or more and 2.0 mm or less. However, the thickness of the carrier 20 is not limited thereto. It is preferable that the carrier 20 is a glass substrate, and the carrier may be a transparent resin substrate having light transmissivity. The carrier 20 may be in the shape of a disc wafer when seen from a plan view, or may be in the shape of a rectangular panel.

The curable bonding adhesive layer 22, for example, can be a member (a curable resin film) in which a resin composition that is a curable bonding adhesive agent is formed into the shape of a film, and can be the support member 24 by being attached to the carrier 20. The curable bonding adhesive agent configuring the curable bonding adhesive layer 22 is a bonding adhesive agent cured by at least one of heat and light, and for example, is a resin composition containing a thermoplastic resin and an epoxy curing agent. The thermoplastic resin contained in the curable bonding adhesive agent has a glass transition temperature of –40° C. or higher and 40° C. or lower. Such a curable bonding adhesive layer 22 may be configured in advance such that the thickness after curing, for example, is 1 μm or more and 400 μm or more. The curable resin film configuring the curable bonding adhesive layer 22 may have tackiness at 25° C., and more specifically, may have tackiness to the extent of being attached to the glass substrate in the environment of 25° C. A bonding adhesive strength of the curable bonding adhesive layer 22 to the carrier 20 may be 1 MPa or more in a case where the curable bonding adhesive layer 22 is cured, and may be 5 MPa or less in a case where the curable bonding adhesive layer 22 is irradiated with laser.

The curable bonding adhesive layer 22 is a portion to be heated by laser irradiation in a laser peeling step described below (refer to FIG. 3D), and it is preferable that the resin composition contains a light absorbing agent absorbing laser light. In a case where the curable bonding adhesive layer 22 is a curable resin film containing the light absorbing agent, the curable bonding adhesive layer 22 has sufficiently low light transmissivity. As the light absorbing agent contained in the curable bonding adhesive layer 22, a material absorbing laser light of excimer laser to produce heat may be selected, and for example, a black pigment or dye, and the like may be added as the light absorbing agent. Specific examples of the light absorbing agent include carbon black, aluminum, nickel, and titanium oxide. The content of the light absorbing agent, for example, can be in a range in which the transmittance of the curable resin film configuring the curable bonding adhesive layer 22 with respect to light at a wavelength of 351 nm is 20% or less. Specifically, the content of the light absorbing agent may be 1% by mass or more and 30% by mass or less, or 1% by mass or more and 20% by mass or less, on the basis of the mass of the curable bonding adhesive layer 22. Here, the transmittance indicates a ratio of the intensity of transmitted light to the intensity of incident light when light having a predetermined wavelength is incident on the curable bonding adhesive layer 22 from one main surface side.

The thermoplastic resin configuring the curable bonding adhesive layer 22 may have a reactive group. The reactive group of the thermoplastic resin, for example, may be an epoxy group. The thermoplastic resin may be a (meth) acrylic copolymer, or may be a (meth)acrylic copolymer having a reactive group. In this specification, "(meth)acryl" is used as the term indicating acryl or methacryl. The same applies to other similar expressions.

The (meth)acrylic copolymer is a copolymer containing a (meth)acrylic monomer having a (meth)acryloyl group, as a monomer unit. The (meth)acrylic copolymer may be a copolymer containing a (meth)acrylic monomer forming a homopolymer with a glass transition temperature of 50° C. or higher, a (meth)acrylic monomer forming a homopolymer with a glass transition temperature of 0° C. or lower, and a (meth)acrylic monomer having an epoxy group, as a monomer unit. A glass transition temperature of a homopolymer formed by the (meth)acrylic monomer having an epoxy group is not limited. The (meth)acrylic monomer forming the homopolymer with the glass transition temperature of 50° C. or higher and the (meth)acrylic monomer forming the homopolymer with the glass transition temperature of 0° C. or lower can be a monomer not having an epoxy group.

A weight average molecular weight of the thermoplastic resin configuring the curable bonding adhesive layer 22 may be 200000 or more and 1000000 or less. Here, the weight average molecular weight can be a value in terms of standard polystyrene, which is measured by gel permeation chromatography. The content of the thermoplastic resin may be 10% by mass or more and 80% by mass or less, on the basis of the mass of the film configuring the curable bonding adhesive layer 22.

The curable resin film configuring the curable bonding adhesive layer 22 may further contain a curable resin that is a compound having a reactive group. The curable resin may be an epoxy resin having two or more epoxy groups, and examples thereof include a bisphenol A-type epoxy resin, a bisphenol F-type epoxy resin, a phenol novolac-type epoxy resin, and a cresol novolac-type epoxy resin. A molecular weight of the curable resin may be 3000 or less. The curable bonding adhesive layer 22 containing the curable resin is likely to have curing properties and suitable tackiness. The content of the curable resin may be 1% by mass or more and 50% by mass or less, on the basis of the mass of the curable resin film configuring the curable bonding adhesive layer 22.

The curable bonding adhesive layer 22 may further contain a silica filler. The content of the silica filler may be 1% by mass or more and 60% by mass or less, or 5% by mass or more and 60% by mass or less, on the basis of the mass of the film configuring the curable bonding adhesive layer 22.

The curable bonding adhesive layer 22 may further contain a curing agent reacting with any one or both of the reactive group of the thermoplastic resin and the reactive group of the curable resin. The curing agent, for example, may be a phenolic resin. In a case where the curable bonding adhesive layer 22 contains the curing agent, the curable bonding adhesive layer 22 may further contain a curing accelerator accelerating the reaction of the curing agent. For example, in a case where the curing agent is the phenolic resin, the curing accelerator may be an imidazole compound.

Figure 2B:
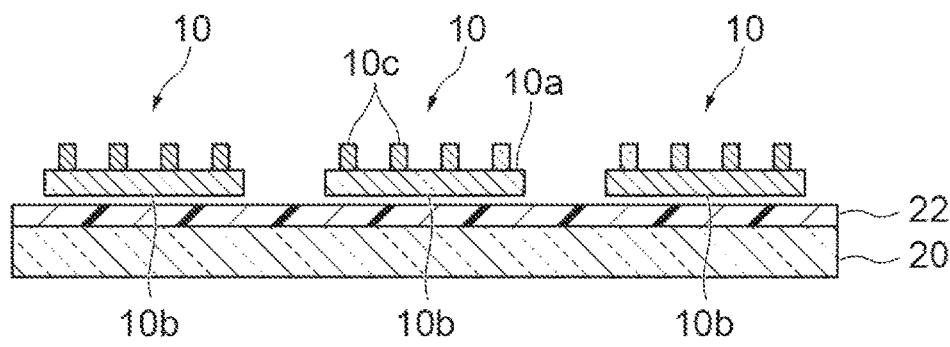

Subsequently, in a case where the preparation of the support member 24 is ended, as illustrated in FIG. 2B, a step of attaching the plurality of semiconductor elements 10 to the support member 24 such that the second surface 10b of each of the plurality of semiconductor elements 10 is directed toward the curable bonding adhesive layer 22 is performed.

Figure 2C:
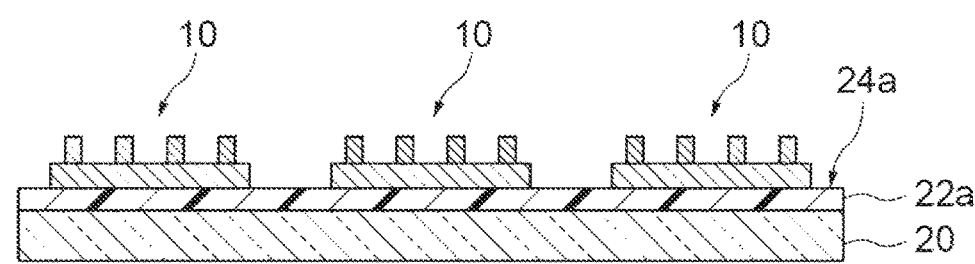

Subsequently, in a case where the semiconductor elements 10 are attached onto the curable bonding adhesive layer 22 of the support member 24, as illustrated in FIG. 2C, the curable bonding adhesive layer 22 is cured by at least one of heat and light to be a cured layer 22a. According to such curing, the plurality of semiconductor elements 10 are fixed to the cured layer 22a of a support member 24a. In this case, a bonding adhesive strength between the cured layer 22a and the semiconductor element 10, for example, may be 4.0 MPa or more, or 20 MPa or more, and may be 8.0 MPa or less.

Figure 2D:
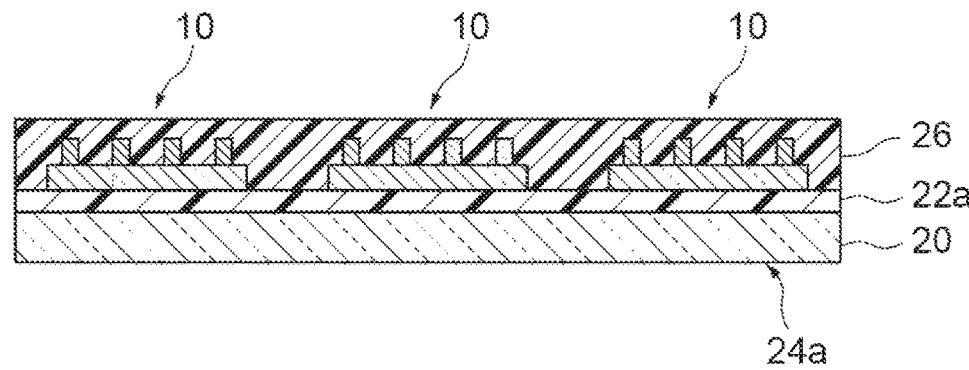

Subsequently, in a case where the semiconductor elements 10 are fixed to the support member 24a, as illustrated in FIG. 2D, the plurality of semiconductor elements 10 are encapsulated with an encapsulant resin (an encapsulant material) such as epoxy. Accordingly, the entire semiconductor element 10 is covered with the encapsulant resin, and is included in an encapsulant material layer 26. In this case, the plurality of semiconductor elements 10 are fixed to the support member 24a, and thus each of the semiconductor elements 10 is not displaced with respect to the carrier 20 (the support member 24a). A material encapsulating the semiconductor elements 10 may be an insulating resin other than epoxy. Note that, in this case, a bonding adhesive strength between the cured layer 22a and the encapsulant material layer 26, for example, may be 4.0 MPa or more, or 20 MPa or more, and may be 8.0 MPa or less. The bonding adhesive strength between the cured layer 22a and the encapsulant material layer 26 may be greater than the bonding adhesive strength between the cured layer 22a and the semiconductor element 10, or may be the same.

Figure 3A:
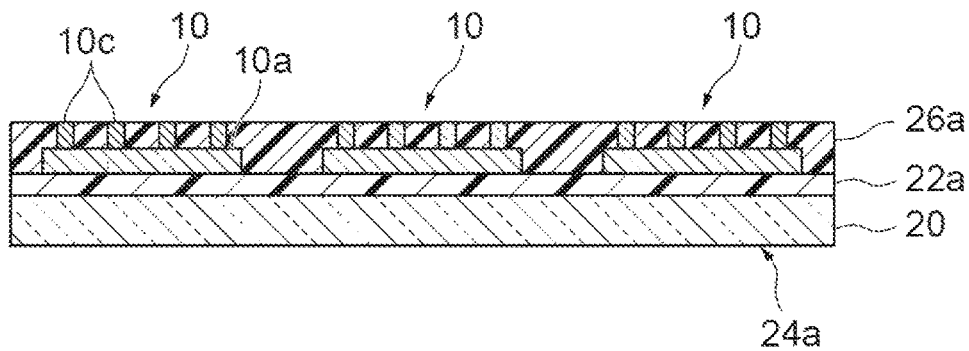
FIGS. 3A to 3D are diagrams illustrating steps that are the method for manufacturing the semiconductor device illustrated in FIG. 1 and are subsequently performed after steps of FIGS. 2A-2D.

Subsequently, in a case where the semiconductor element 10 is encapsulated with the encapsulant resin, as illustrated in FIG. 3A, a step of grinding the encapsulant material layer 26 is performed in a state where the plurality of semiconductor elements 10 are fixed to the support member 24a (the carrier 20). In such a grinding step, for example, the encapsulant material layer 26 is ground to the extent that the connection terminals 10c disposed on the first surface 10a side of the semiconductor elements 10 are exposed to the outside from the encapsulant resin. Accordingly, the connection terminals 10c of each semiconductor element 10 are exposed from the surface of the ground encapsulant material layer 26a such that connection is available.

Figure 3B:
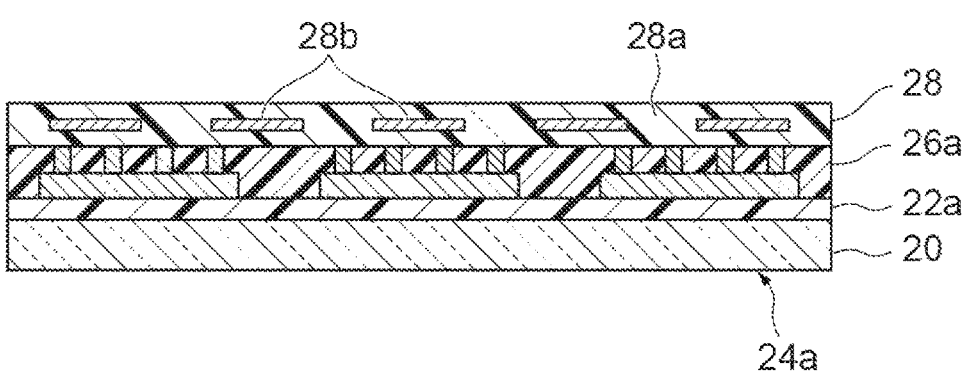

Subsequently, in a case where the grinding of the encapsulant material layer is ended, as illustrated in FIG. 3B, a re-distribution layer 28 is formed above the first surfaces 10a of the plurality of semiconductor elements 10 fixed to the support member 24a in a state where the plurality of semiconductor elements 10 are fixed to the support member 24a (the carrier 20). The re-distribution layer 28 is a portion corresponding to the re-distribution layer 13 of the semiconductor device 1 described above, and includes an insulating layer portion 28a such as polyimide, and a wiring portion 28b in the insulating layer portion 28a, such as copper wiring. In the step of forming the re-distribution layer 28, the formation of the insulating layer and the formation of the wiring portion are repeated a predetermined number of times, and a wiring layer for pitch conversion is formed. In this manufacturing method, the re-distribution layer 28 is formed in a state where the semiconductor elements 10, the encapsulant material layer 26a, and the like are stably disposed on the carrier 20, and thus a fine re-distribution layer is easily constructed.

Figure 3C:
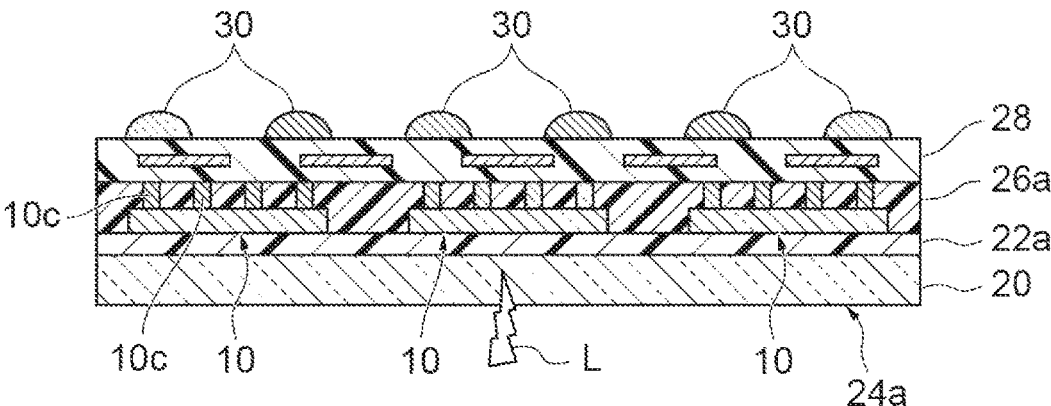

Subsequently, in a case where the re-distribution layer is formed, as illustrated in FIG. 3C, solder balls 30 are formed such that the connection terminals 10c of the plurality of semiconductor elements 10 are connected to the solder balls 30 through the re-distribution layer 28 in a state where the plurality of semiconductor elements 10 are fixed to the support member 24a (the carrier 20). In this case, the solder balls 30 are formed such that the pitch thereof is wider than the terminal pitch of the connection terminals 10c of the semiconductor elements 10. Such a solder ball 30 corresponds to the solder ball 14 in the semiconductor device 1 described above.

Figure 3D:
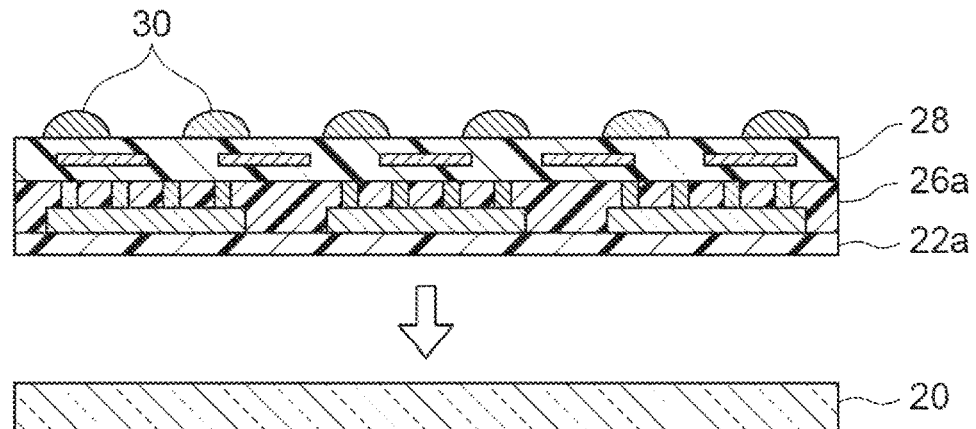

Subsequently, in a case where the attaching of the solder balls 30 is performed, laser marking is performed with respect to the cured layer 22a by irradiating the cured layer 22a with laser light L from the carrier 20 side to write necessary information such as a product name, and as illustrated in FIG. 3D, the carrier 20 is removed from the cured layer 22a by the irradiation of the laser light L. The laser used for removing the carrier 20, for example, is excimer laser that is one type of UV laser, and the transmittance of the carrier 20 including the glass substrate with respect to the laser light is 99% or more. More specifically, for example, by irradiating the cured layer 22a with laser light at a wavelength of 351 nm from the excimer laser, the light absorbing agent in the cured layer 22a produces heat, which causes peeling between the cured layer 22a and the carrier 20. Note that, the wavelength of the laser light applied to the cured layer 22a from the excimer laser may be 532 nm, or may be other wavelengths. For example, the laser used herein may be excimer laser such as XeF excimer laser (a wavelength of 351 nm), XeCl excimer laser (a wavelength of 303 nm), KrF excimer laser (a wavelength of 248 nm), and ArF excimer laser (a wavelength of 193 nm), or may be YAG laser (a triple wave) (a wavelength of 355 nm), YAG laser (a quadruple wave) (a wavelength of 266 nm), and the like, which are other UV laser beams. The same applies to laser used hereinafter.

When the carrier 20 is removed from the cured layer 22a, the carrier 20 may be removed by applying the laser light such that peeling energy for peeling off the carrier 20 is 1 $kW/cm^2$ or more and 200 $kW/cm^2$ or less. In this case, the carrier can be removed with low energy, and thus it is possible to minimally suppress a heat damage to the semiconductor elements 10 or the like, and to minimally suppress the dust generated after the laser irradiation. Since the laser to be applied has low energy, it is possible to shorten the time for removing the carrier.

In the carrier removing step described above, a method for peeling off the carrier by the laser light is used, but a method for removing the carrier is not limited thereto. For example, the carrier 20 may be scraped from the cured layer 22a, or the carrier 20 or the like may be dissolved (melted) in a predetermined solvent. In such a removing step, the cured layer 22a may be removed together. In addition, after such a removing step, the exposed surface of the cured layer 22a, or the exposed surface of the encapsulant material layer 26a of the encapsulant material in a case where the cured layer 22a is removed may be cleaned by a predetermined method. Accordingly, it is possible to make the surface side of the semiconductor device 1 that is the final product cleaner. Note that, in a case where the carrier 20 is removed by such a method, the carrier 20 may not be a light transmissive substrate, and the curable bonding adhesive layer 22 may not contain the light absorbing agent.

Figure 4A:
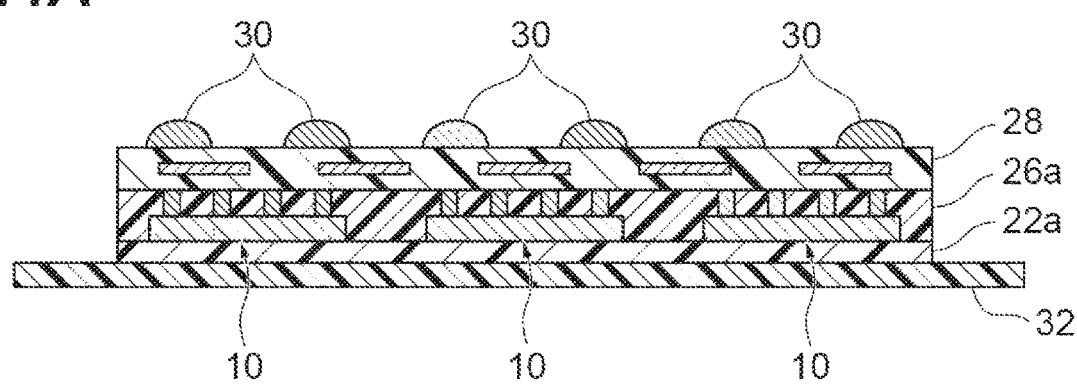
FIGS. 4A to 4D are diagrams illustrating steps that are the method for manufacturing the semiconductor device illustrated in FIG. 1 and are subsequently performed after the steps of FIGS. 3A-3D.
Figure 4B:
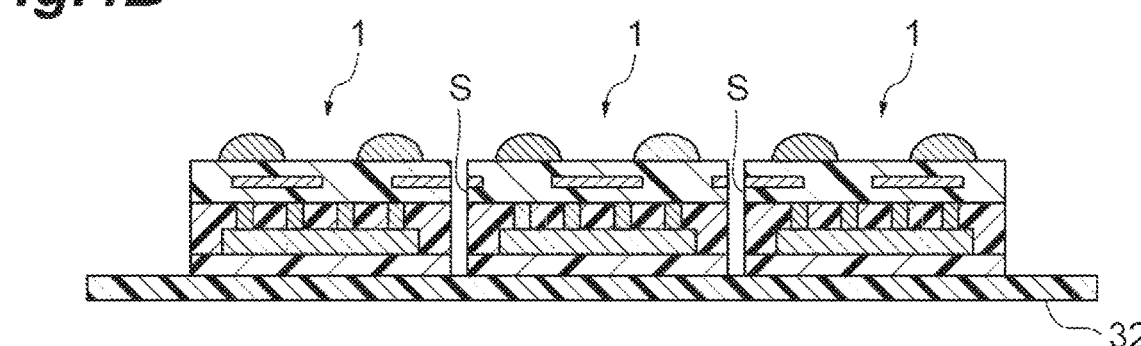
Figure 4C:
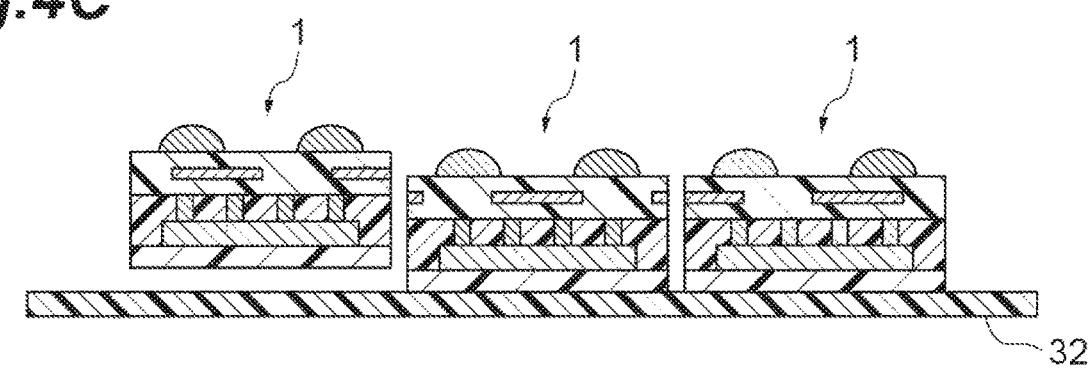
Figure 4D:
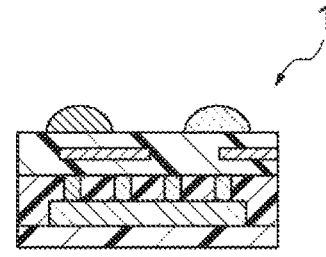

Subsequently, in a case where the carrier 20 is removed, as illustrated in FIG. 4A, a dicing tape 32 is attached to the exposed surface side of the cured layer 22a to be a wafer-shaped or panel-shaped die redisposition body. Then, as illustrated in FIG. 4B and FIG. 4C, each portion including the semiconductor element 10 is singulated by dicing the die redisposition body at a predetermined spot S to be each of the semiconductor devices 1. Accordingly, it is possible to obtain a plurality of semiconductor devices 1 illustrated in FIG. 4D and FIG. 1 from the die redisposition body in which the plurality of semiconductor elements 10 are redisposed. When the singulating is performed, the cured layer 22a is singulated together with the semiconductor element 10, and thus the semiconductor device 1 is acquired from each of the plurality of semiconductor elements 10 in which the second surface 10b is protected with the cured layer 22a.

Here, a function effect of the method for manufacturing the semiconductor device 1 according to this embodiment will be described in contrast to a method of Comparative Example. FIGS. 5A-5D to FIGS. 7A-7D are diagrams sequentially describing a first method (face-up, without a support plate) for manufacturing a semiconductor device having a fan-out structure. FIGS. 8A-8E to FIGS. 10A-10F are diagrams sequentially illustrating a second method (face-up, with a support plate) for manufacturing a semiconductor device having a fan-out structure. First, the first method illustrated in FIGS. 5A-5D to FIGS. 7A-7D, and the contrast thereto will be described.

(First Method and Contrast)

Figure 5A:
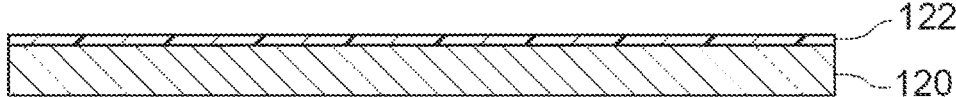
FIGS. 5A to 5E are diagrams illustrating a part of a first method (face-up, without a support plate) for manufacturing a semiconductor device.
Figure 5B:
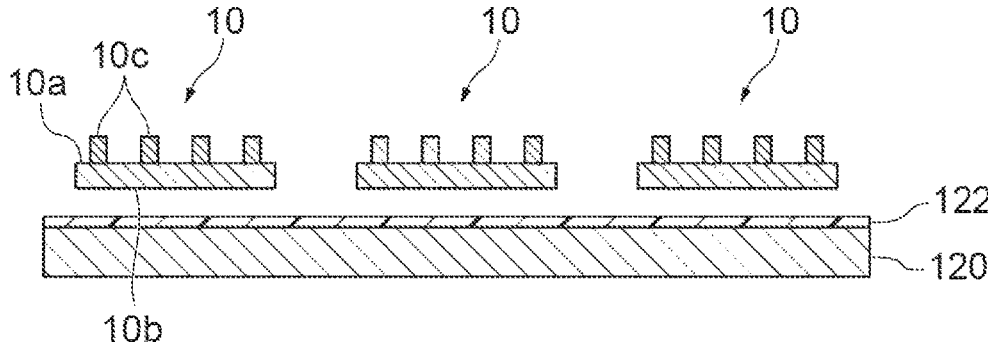
Figure 5C:
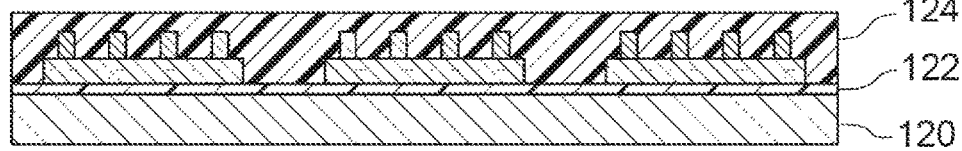

As illustrated in FIG. 5A, in the first method according to Comparative Example, first, an adhesive layer 122 is provided on a metallic carrier 120. As the adhesive layer 122, for example, a peeling sheet having an adhesive force at an ordinary temperature, in which the adhesive force is decreased by heating, and the like can be used. Then, as illustrated in FIG. 5B, the plurality of semiconductor elements 10 are disposed on the adhesive layer 122 such that the second surface 10b of each of the plurality of semiconductor elements 10 is directed toward the adhesive layer 122 (that is, face-up). After that, as illustrated in FIG. 5C, an encapsulant material layer 124 is formed by encapsulating the semiconductor elements 10 with the encapsulant material, and in a case where the encapsulating is ended, the adhesive layer 122 is peeled off from the semiconductor elements 10 by heating the adhesive layer 122 or the like to remove the carrier 120 (refer to FIG. 5D).

Figure 5D:
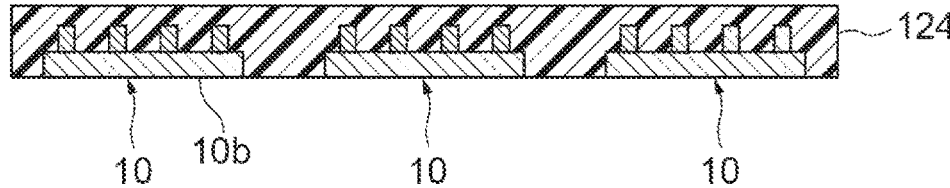
Figure 5E:
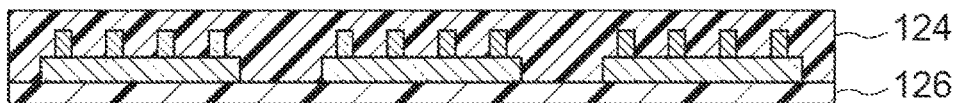
Figure 6A:
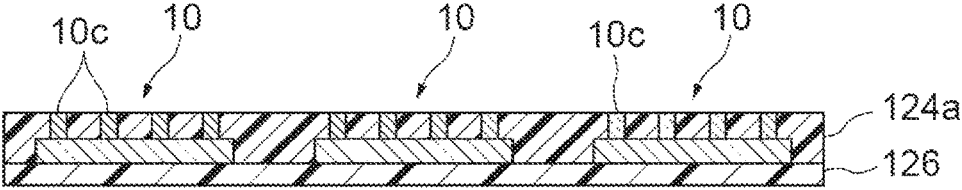
FIGS. 6A to 6D are diagrams illustrating steps that are the first method for manufacturing a semiconductor device and are subsequently performed after steps of FIGS. 5A-5E.
Figure 6B:
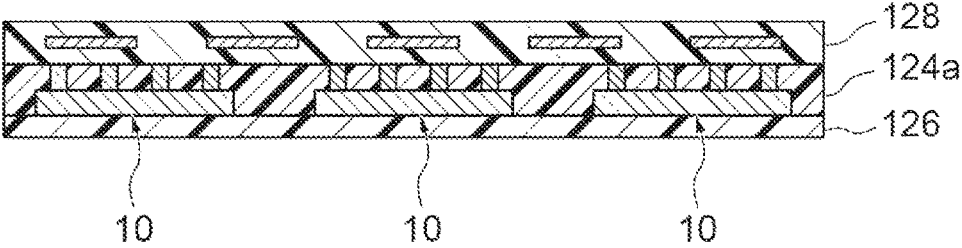
Figure 6C:
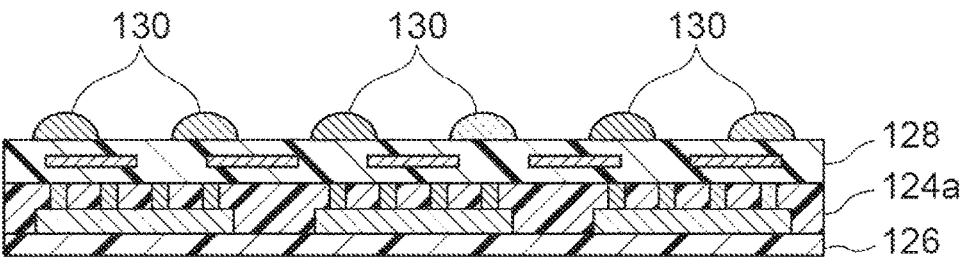

Subsequently, as illustrated in FIG. 5E, a protective film 126 is attached to the surface of the encapsulant material layer 124 on a side where the semiconductor elements 10 are exposed. The protective film 126, for example, is referred to as backside coat (BSC) or the like, and is a film protecting the semiconductor elements 10 from contamination in the subsequent step. Such a protective film, for example, contains an epoxy resin. Then, as illustrated in FIG. 6A, the encapsulant material layer 124 on the protective film 126 is ground until the connection terminals 10c of the semiconductor device 1 is exposed to be an encapsulant material layer 124a. After that, as illustrated in FIG. 6B and FIG. 6C, a re-distribution layer 128 and solder balls 130 are sequentially formed above the semiconductor elements 10 disposed on the protective film 126.

Figure 6D:
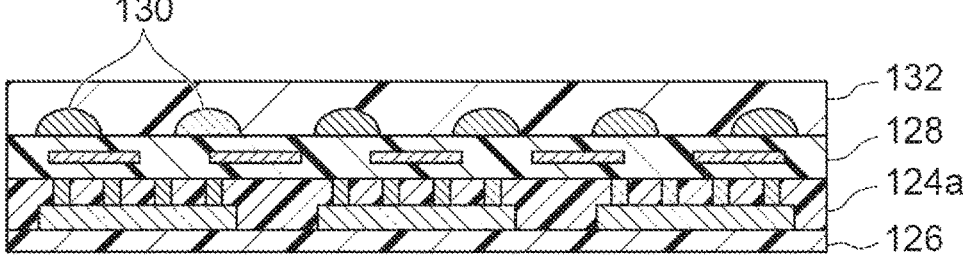
Figure 7A:
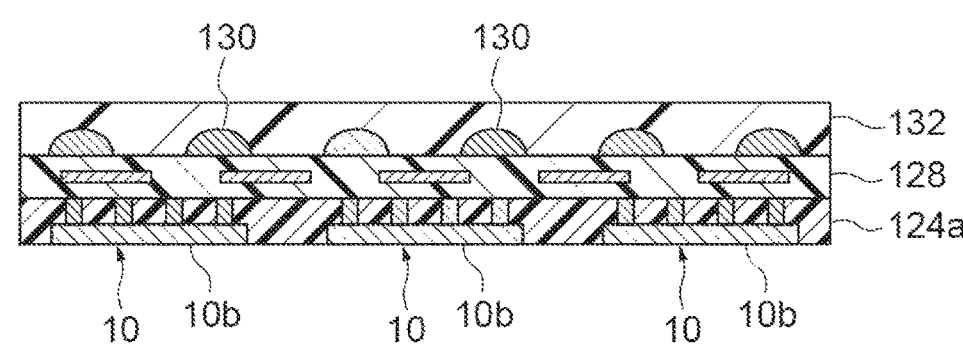
FIGS. 7A to 7D are diagrams illustrating steps that are the first method for manufacturing a semiconductor device and are subsequently performed after the steps of FIGS. 6A-6D.
Figure 7B:
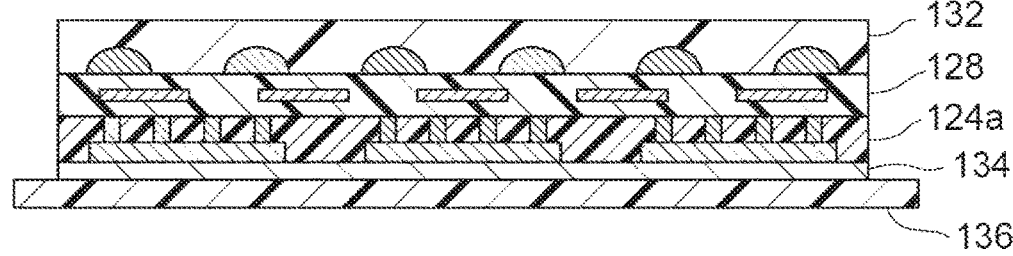
Figure 7C:
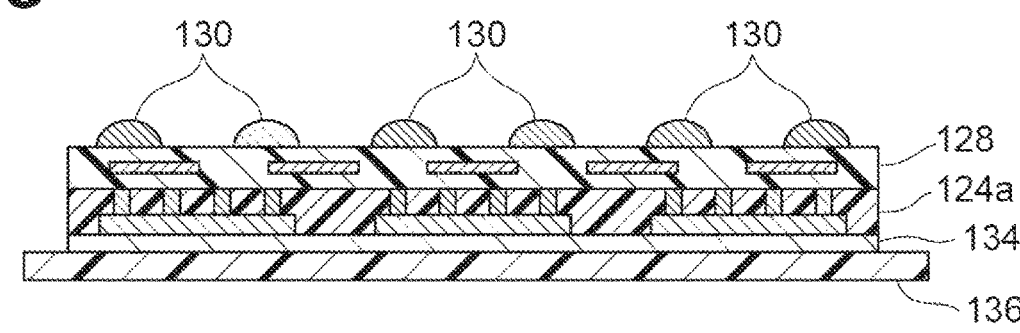
Figure 7D:
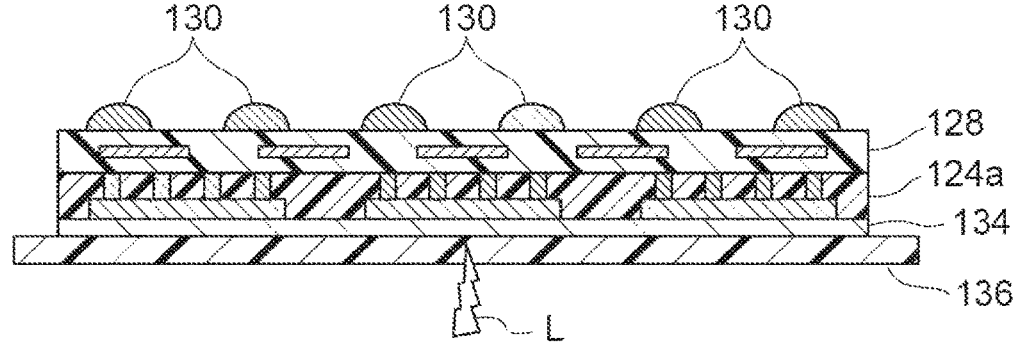

Subsequently, in a case where the solder balls 130 are formed, as illustrated in FIG. 6D, a protective tape 132 (a BG tape) protecting the solder balls 130 is further attached. The protective tape 132, for example, contains polyolefin. Then, as illustrated in FIG. 7A, a treatment for scraping the protective film 126 is performed in a state where the solder balls 130 are protected with the protective tape 132. In this case, a part of the second surface 10b of each semiconductor element 10 may be scraped such that thinning is obtained. After that, as illustrated in FIG. 7B and FIG. 7C, a dicing tape 136 is attached through a BSC film 134, and in such a state, a step of removing the protective tape 132 is performed. The BSC film 134, for example, contains an epoxy resin. Then, in a case where the removing of the protective tape 132 is ended, as illustrated in FIG. 7D, the laser marking is performed with respect to the BSC film 134 by the laser light L to write necessary information such as a product name. The BSC film 134 configures a part of the semiconductor device. After that, each portion including the semiconductor element 10 is singulated by dicing in accordance with the same method as the method illustrated in FIG. 4A to FIG. 4D to obtain each of the semiconductor devices.

As described above, in the first method according to Comparative Example, in the step of treating the semiconductor elements 10, at least, three types of films of the carrier 120 and the adhesive layer 122 (refer to FIG. 5A), the protective film 126 (refer to FIG. 5E), and the BSC film 134 (refer to FIG. 7B) are used. In contrast, in the method according to this embodiment, one type of member including the carrier 20 and the curable bonding adhesive layer 22 is used in many parts of the steps, and integration is performed with respect to such one member. Therefore, according to the manufacturing method of this embodiment, it is possible to considerably decrease the number of members to be used, to considerably decrease the number of steps of attaching each of the members and removing steps thereof, and to considerably simplify a process of manufacturing the semiconductor device 1, compared to the first method.

In the first method, in the steps illustrated in FIG. 5B and FIG. 5C, the semiconductor elements 10 are disposed on the adhesive layer 122, and is encapsulated with the encapsulant material. Accordingly, the semiconductor elements 10 are easily displaced on the carrier 120. Moreover, as the adhesive layer 122, a thermally foaming film is used, and in this case, the semiconductor elements 10 are easily displaced further. In contrast, in the method according to this embodiment, in the steps illustrated in FIG. 2B and FIG. 2C, the semiconductor elements 10 are disposed on the curable bonding adhesive layer 22, and the semiconductor elements 10 are fixed to the carrier 20 or the like by curing the curable bonding adhesive layer 22 before performing a treatment such as encapsulating with the encapsulant material. Therefore, according to the manufacturing method of this embodiment, it is possible to reliably prevent the displacement of the semiconductor elements 10, compared to the first method.

In the first method, as illustrated in FIG. 5C to FIG. 5E, the carrier 120 or the like may be a material not having heat resistance/chemical resistance, and thus the carrier 120 is removed in the early stage of the treating step, and the encapsulant material layer 124 is ground on the protective film 126 containing a comparatively soft material. Accordingly, the flatness of the die redisposition body in which the plurality of semiconductor elements 10 are redisposed is degraded, that is, the flatness of the encapsulant material layer 124 or the semiconductor elements 10 are degraded, and it is difficult to finely form the re-distribution layer 128 to be subsequently formed. In contrast, in the method according to this embodiment, as illustrated in FIG. 2D and FIG. 3A, the carrier 20 contains a material having heat resistance/chemical resistance, and thus the carrier 20 can be continuously used, and grinding is performed in a state where the encapsulant material layer 26 is disposed on the carrier 20. Therefore, according to the manufacturing method of this embodiment, it is easy to make the flatness of the encapsulant material layer 26 and the semiconductor elements 10 excellent, and it is possible to finely form the re-distribution layer 28 to be subsequently formed, compared to the first method.

In the first method, as illustrated in FIG. 5D to FIG. 7B, the back surface (for example, the protective film 126 and the BSC film 134) of the die redisposition body in which the plurality of semiconductor elements 10 are disposed is the epoxy resin, contamination may occur in the step. In addition, a resin component of epoxy may be eluted by chemicals used in the step, and in this case, a yield ratio of the copper wiring or the like by a plating step (wiring formation) in the re-distribution layer may be affected. In contrast, in the method according to this embodiment, as illustrated in FIG. 3A to FIG. 3D, in each step, the back surface of the die redisposition body is continuously covered with the carrier 20, and thus it is possible to prevent the contamination or the elution described above. That is, it is possible to maintain a step of manufacturing the semiconductor device 1 in the state of high cleanliness.

In the first method, as illustrated in FIG. 6B to FIG. 7B, the back surface of the die redisposition body in which the semiconductor elements 10 are redisposed is the epoxy resin, which may cause contamination in the device environment or the like, it is necessary to provide the die redisposition body separately from a case, a manufacturing device, and a conveyance/suction mechanism used for manufacturing a fan-in wafer level package (WLP) of which the back surface is silicon or the like. In contrast, in the manufacturing method according to this embodiment, as illustrated in FIG. 3A to FIG. 3D, in each step, the back surface of the die redisposition body is covered with the carrier 20 containing glass or the like, and thus it is possible to prevent the contamination or the like as described above. As a result thereof, according to the manufacturing method of this embodiment, it is possible to manufacture the semiconductor device having a fan-out structure, such as FO-WLP, by using the same manufacturing facility or the like as that for the fan-in WLP.

In the first method, as illustrated in FIG. 6D and FIG. 7A, the solder balls 130 are protected by further using the protective tape 132 for removing the protective film 126 attached after the carrier 120. In contrast, in the manufacturing method according to this embodiment, the carrier 20 and the curable bonding adhesive layer 22 are mainly used, and the members used in each treating step are integrated by using one member. Therefore, according to the manufacturing method of this embodiment, it is possible to further decrease the number of members to be used, to further decrease the number of steps of attaching each of the members and removing steps thereof, and to further simplify the process of manufacturing the semiconductor device 1, compared to the first method.

In the first method, as illustrated in FIG. 5B and FIG. 5C, the carrier 120 is removed in the early stage, and thus it is not possible to perform each step by making the die redisposition body in which the semiconductor elements 10 are redisposed extremely thin, and it is difficult to reduce the height. In contrast, in the method according to this embodiment, the carrier 20 and the curable bonding adhesive layer 22 are mainly used, and each treating step is performed by using one member from the initial stage of the step. Therefore, according to the manufacturing method of this embodiment, it is possible to make the die redisposition body thin from the beginning, and to further reduce the height of the semiconductor device 1.

In the manufacturing method according to this embodiment, the bonding adhesive strength between the cured curable bonding adhesive layer (the cured layer 22a) and the encapsulant material layer 26 may be 4.0 MPa or more. In this case, it is possible to keep the bonding adhesive strength between the cured layer 22a and the encapsulant material layer 26 strong, to prevent peeling after package assembly, and to allow the cured layer 22a to function as it is as a part (the protective layer 12) of the final product of the semiconductor device 1. In this case, the bonding adhesive strength between the cured curable bonding adhesive layer and the encapsulant material may be 8.0 MPa or less. The bonding adhesive strength between the cured layer 22a and the encapsulant material layer 26 may be 20 MPa or more. In this case, it is possible to keep the bonding adhesive strength between the cured layer 22a and the encapsulant material layer 26 stronger, to prevent the peeling after the package assembly, and to allow the cured layer 22a to function as it is as a part (the protective layer 12) of the final product of the semiconductor device 1.

In the manufacturing method according to this embodiment, the bonding adhesive strength between the cured curable bonding adhesive layer (the cured layer 22a) and the plurality of semiconductor elements 10 may be 4.0 MPa or more. In this case, it is possible to keep the bonding adhesive strength between the cured layer 22a and the plurality of semiconductor elements 10 (for example, silicon chips) strong, to prevent the peeling after the package assembly, and to allow the cured layer 22a to function as it is as a part of the final product of the semiconductor device 1.

In the manufacturing method according to this embodiment, the semiconductor device 1 in a state where the cured curable bonding adhesive layer (the cured layer 22a) protects the second surface 10b of each of the plurality of semiconductor elements 10 may be acquired. In this case, it is possible to allow the cured layer 22a used in the manufacturing to function as it is as a part (the protective layer 12) of the final product of the semiconductor device 1.

(Second Method and Contrast)

Figure 8A:
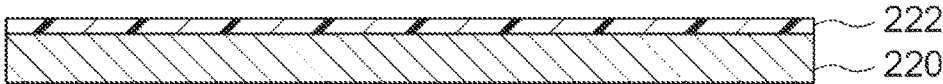
FIGS. 8A to 8E are diagrams illustrating a part of a second method (face-up, with a support plate) for manufacturing a semiconductor device.
Figure 8B:
Figure 8C:
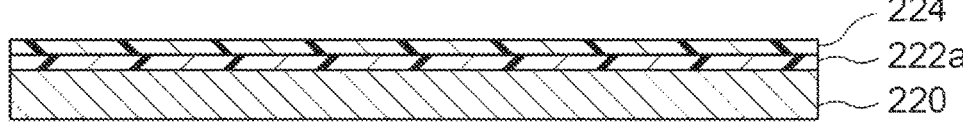
Figure 8D:
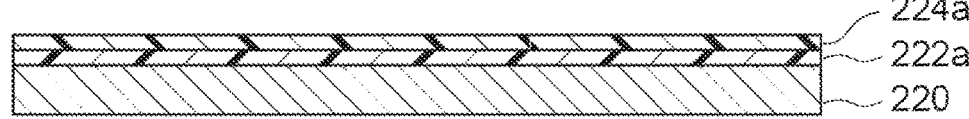

Next, the second method according to Comparative Example, illustrated in FIGS. 8A-8E to FIGS. 10A-10F, and the contrast thereto will be described. As illustrated in FIG. 8A, in the second method, first, a curable peeling layer 222 is provided on a glass carrier 220. Then, as illustrated in FIG. 8B, the curable peeling layer 222 is baked by heat or the like to be a cured layer 222a. After that, as illustrated in FIG. 8C and FIG. 8D, a thermoplastic temporary fixing layer 224 is formed on the cured layer 222a, and the temporary fixing layer 224 is baked and cured by heat or the like to be a cured layer 224a.

Figure 8E:
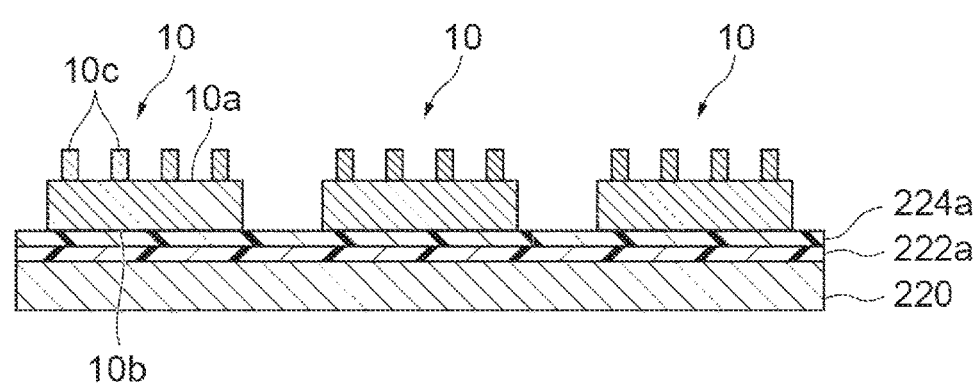
Figures 9A, 9B, 9C, 9D, 9E:
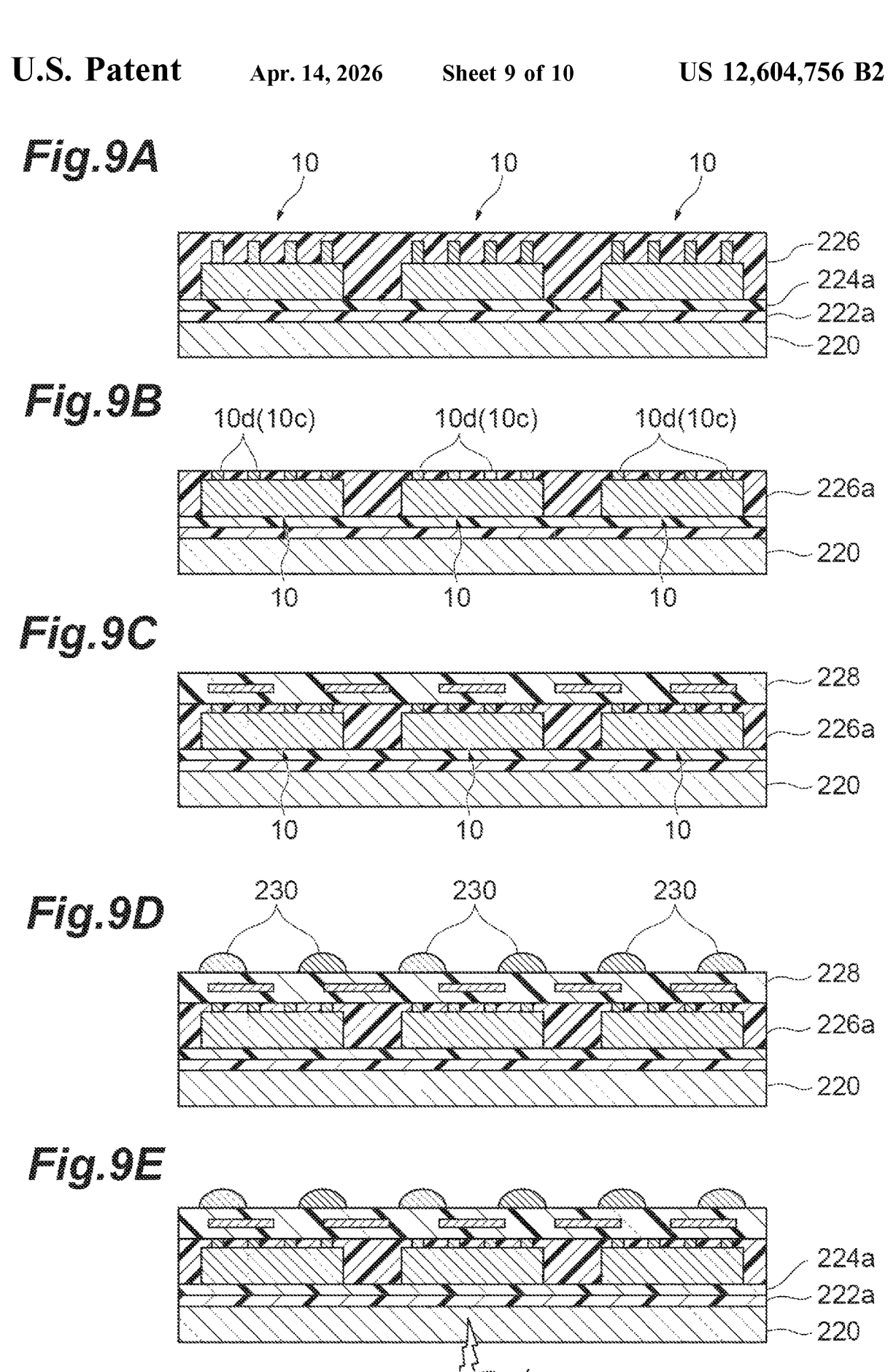
FIGS. 9A to 9E are diagrams illustrating steps that are the second method for manufacturing a semiconductor device and are subsequently performed after steps of FIGS. 8A-8E.

Subsequently, as illustrated in FIG. 8E, the plurality of semiconductor elements 10 are disposed on the cured layer 224a such that the second surface 10b of each of the plurality of semiconductor elements 10 is directed toward the cured layer 224a (that is, face-up). In this case, the cured layer 224a containing a temporary fixing material is a thermoplastic resin, and thus the semiconductor elements 10 are temporarily fixed at a high temperature and a high pressure. After that, as illustrated in FIG. 9A, the semiconductor elements 10 are encapsulated with the encapsulant material to form an encapsulant material layer 226. In a case where the encapsulating is ended, as illustrated in FIG. 9B, the encapsulant material layer 226 is ground until the connection terminals 10c of the semiconductor elements 10 are exposed to be an encapsulant material layer 226*a*. In this case, the connection terminals 10*c* may also be ground such that the connection terminals 10*c* are formed as a shorter connection terminals 10*d*. After that, as illustrated in FIG. 9C and FIG. 9D, a re-distribution layer 228 and solder balls 230 are sequentially formed above the semiconductor elements 10.

Figures 10A, 10B, 10C, 10D, 10E, 10F:
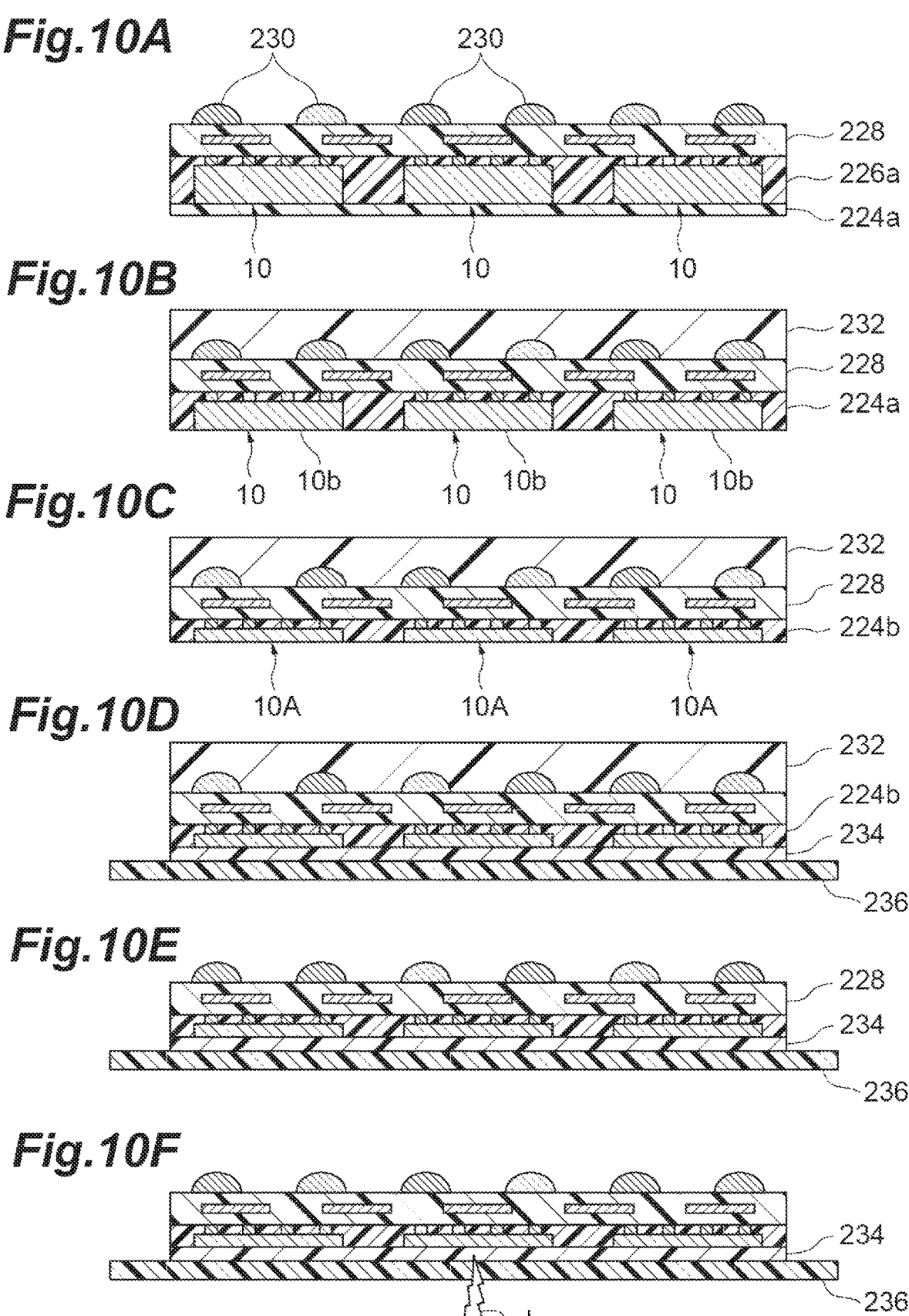
FIGS. 10A to 10F are diagrams illustrating steps that are the second method for manufacturing a semiconductor device and are subsequently performed after the steps of FIGS. 9A-9E.

Subsequently, as illustrated in FIG. 9E, the cured layer 222*a* is irradiated with the laser light L from the carrier 220 side, and the cured layer 222*a* is melted by heat to peel off the carrier 220. Accordingly, as illustrated in FIG. 10A, the cured layer 224*a* is exposed to the surface side. After that, as illustrated in FIG. 10B, a protective tape 232 protecting the solder balls 230 is further attached. The protective tape 232, for example, contains polyolefin. Then, in a state where the solder balls 230 are protected with the protective tape 232, the cured layer 224*a* is removed by a predetermined cleaning treatment, and the second surface 10*b* of each of the semiconductor elements 10 is exposed to the outside. Further, as illustrated in FIG. 10C, the second surface 10*b* of each of the semiconductor elements 10 may be ground to be thin to form a semiconductor element 10A.

Subsequently, as illustrated in FIG. 10D and FIG. 10E, a dicing tape 236 is attached through a BSC film 234, and in such a state, a step of removing the protective tape 232 is performed. The BSC film 234, for example, contains an epoxy resin. Then, in a case where the removing of the protective tape 232 is ended, as illustrated in FIG. 10F, the laser marking is performed with respect to the BSC film 234 by the laser light L to write necessary information such as a product name. After that, each portion including the semiconductor element 10 is singulated by dicing in accordance with the same method as the method illustrated in FIG. 4A to FIG. 4D to obtain each of the semiconductor devices.

As described above, in the second method according to Comparative Example, in the step of treating the semiconductor element 10, at least, three types of members of the curable peeling layer 222 (refer to FIG. 8A and FIG. 8B), the thermoplastic temporary fixing layer 224 (refer to FIG. 8C and FIG. 8D), and the protective tape 232 (refer to FIG. 10B and FIG. 10C) are used. In contrast, in the method according to this embodiment, one type of member including the carrier 20 and the curable bonding adhesive layer 22 is mainly used, and integration is performed such that each treating step is performed by using such one member. Therefore, according to the manufacturing method of this embodiment, it is possible to considerably decrease the number of members to be used, to considerably decrease the number of steps of attaching each of the members and removing steps thereof, and to considerably simplify the process of manufacturing the semiconductor device 1, compared to the second method.

In the second method, in the step illustrated in FIG. 8E, the cured layer 224*a* that is the temporary fixing material has thermoplastic properties, and thus it is necessary to attach the semiconductor elements 10 to the carrier 220 by pressurizing the cured layer 224*a* for a long period of time. Accordingly, a cycle time of the step in FIG. 8E tends to increase. In contrast, in the method according to this embodiment, in the steps described in FIG. 2B and FIG. 2C, the semiconductor elements 10 are disposed on the curable bonding adhesive layer 22, and the semiconductor elements 10 are fixed to the carrier 20 or the like by curing the curable bonding adhesive layer 22 before performing a treatment such as encapsulating with the encapsulant material. Therefore, according to the manufacturing method of this embodiment, it is possible to fix the semiconductor elements 10 to the carrier 20 at a low temperature and a low pressure in a short cycle time, compared to the second method.

In the second method, in the steps illustrated in FIG. 8A to FIG. 8D, the installation and the baking of the curable peeling layer 222, and the installation and the baking of the thermoplastic temporary fixing layer 224 are performed to attach the semiconductor elements 10 to the carrier 220. Accordingly, in order to attach the semiconductor elements 10 to the carrier 220, the step becomes complicated, and the number of members to be used increases. In contrast, in the method according to this embodiment, in the steps illustrated in FIG. 2B and FIG. 2C, the semiconductor elements 10 are disposed on the curable bonding adhesive layer 22, and the semiconductor elements 10 are fixed to the carrier 20 or the like by curing the curable bonding adhesive layer 22. Therefore, according to the manufacturing method of this embodiment, it is possible to more simply connect the semiconductor elements 10 to the carrier 20, compared to the second method.

In the second method, as illustrated in FIG. 10D, a product may be used in which the dicing tape 236 and the BSC film 234 are integrated after grinding. Such an integrated product may not have sufficient adhesive residue, dicing properties, pick-up properties, and the like, and it is difficult to reduce the height of semiconductor device 1. In contrast, in the method according to this embodiment, the curable bonding adhesive layer 22 used for initially fixing the semiconductor elements 10 to the carrier 20 is used as it is in the semiconductor device 1, and thus it is not necessary to use such an integrated product, and it is possible to use an individual dicing tape. Accordingly, it is possible to reduce the height of the semiconductor device by using a dicing tape suitable for reducing the height. In addition, in the manufacturing method according to this embodiment, the carrier 20 and the curable bonding adhesive layer 22 are mainly used, and each treating step is performed by using one member from the initial stage of the step. Therefore, according to the manufacturing method of this embodiment, it is possible to make the die redisposition body thin from the beginning, and to further reduce the height of the semiconductor device 1.

In the second method, as illustrated in FIG. 9E and FIG. 10A, in the middle of the step, it is necessary to peel off the cured layer 222*a* and the carrier 220 for peeling by laser, and to clean and remove the cured layer 224*a* that is the bonding adhesive agent remaining in the die redisposition body with a solvent. Accordingly, the step for removing the carrier 220 becomes complicated, which requires great care. In contrast, in the manufacturing method according to this embodiment, as illustrated in FIG. 3D, the carrier 20 is removed by irradiating the cured layer 22*a* with laser, and most of the cured layer 22*a* is used as it is as a part (the protective layer 12) of the semiconductor device 1. Accordingly, it is possible to simplify the work of removing the carrier 20.

As described above, in the manufacturing method according to this embodiment, it is possible to considerably simplify the step of manufacturing the semiconductor device 1 having a fan-out structure, compared to the first method and the second method according to Comparative Example. In addition, the displacement of the semiconductor elements 10 can be reduced, and thus it is possible to prepare the semiconductor devices 1 of which the size and the height are further reduced, with a more excellent accuracy.

The embodiments of the present invention has been described in detail, but the present invention is not limited to the embodiments described above, and can be applied to various embodiments. For example, in the embodiments described above, the method for manufacturing the semiconductor device 1 including the semiconductor element 10 is described, but the present invention may be applied to a method for manufacturing a semiconductor device or a device including a plurality of electronic components by adding the plurality of electronic components to the semiconductor elements 10 or replacing the semiconductor elements 10 to the electronic components. In this case, in the attaching step illustrated in FIG. 2B, the plurality of electronic components are attached to the support member 24 together with the plurality of semiconductor elements 10, and in the fixing step illustrated in FIG. 2C, the plurality of electronic components are fixed to the support member 24 by curing the curable bonding adhesive layer 22 together with the semiconductor elements 10. The other steps can be the same as the steps described above. According to such a manufacturing method, it is possible to form a more complicated semiconductor device or the like. Here, the electronic component, for example, may be a passive element such as a capacitor or a resistor, or may be a component such as MEMS.

EXAMPLES

Hereinafter, the present invention will be described in more detail by using Examples. Here, the present invention is not limited to such examples. In the following examples, the bonding adhesive strength between the curable bonding adhesive layer 22 (the cured layer 22a after curing, and the protective layer 12) and the encapsulant material layer 26, used in the method for manufacturing a semiconductor device according to the embodiment described above, and the peeling energy for the glass substrate from the cured layer 22a will be described. The bonding adhesive strength between the cured layer 22a and the encapsulant material layer 26 can be applied to the bonding adhesive strength between the cured layer 22a and the semiconductor elements 10.

As raw materials for the curable bonding adhesive layer, the followings were prepared.

[Thermoplastic Resin]
    Acrylic polymer having epoxy group: (Glass transition temperature: 12° C.)

[Epoxy Resin]
    Bisphenol F-Type liquid epoxy resin: YDF-8170C (Product name, manufactured by NIPPON STEEL Chemical & Material Co., Ltd.)
    Cresol novolac-type epoxy resin: N-500P-10 (Product name, manufactured by DIC Corporation)

[Curing Agent]
    Phenolic resin: PSM-4326 (Product name, manufactured by Gun Ei Chemical Industry Co., Ltd.)
    Phenolic resin: MEH-7800M (Product name, manufactured by Meiwa Plastic Industries, Ltd.)

[Silica Filler]
    SC2050-HLG (Product name, manufactured by ADMATECHS COMPANY LIMITED)
    R972 (Product name, manufactured by NIPPON AEROSIL CO., LTD.)

[Light Absorbing Agent]
    Carbon black: FP-Black (Product name, manufactured by SANYO COLOR WORKS, Ltd.)

[Coupling Agent]
    (3-mercaptopropyl) trimethoxysilane: A-189 (Product name, manufactured by Momentive Performance Materials)

3-ureidopropyl triethoxysilane: A-1160 (Product name, manufactured by Momentive Performance Materials)

[Curing Accelerator]
    1-cyanoethyl-2-phenylimidazole: 2PZ-CN (Product name, manufactured by SHIKOKU CHEMICALS CORPORATION)

Subsequently, as a material used in the curable bonding adhesive layer, a resin varnish containing each raw material at a compound ratio shown in Table 1 described below, and cyclohexanone as a solvent was prepared. The total concentration of components other than the solvent in the resin varnish was 40% by mass, on the basis of the mass of the varnish.

TABLE 1

| Raw material | | Curable resin film | |
| --- | --- | --- | --- |
| | | A | B |
| Thermoplastic resin (Glass transition temperature: 12° C.) | | 15 | 65 |
| Epoxy resin | YDF-8170C | 15 | — |
| | N-500P-10 | 5 | 15 |
| Curing agent | PSM-4326 | 15 | — |
| | MEH-7800M | — | 10 |
| Silica filler | SC2050-HLG | 50 | — |
| | R972 | — | 10 |
| Light absorbing agent | FP-Black | 3 | 3 |
| Coupling agent | A-189 | 0.1 | 0.4 |
| | A-1160 | 0.3 | 1.1 |
| Curing accelerator | 2PZ-CN | 0.05 | 0.03 |

A support film was coated with each varnish, and the coated film was dried to form a curable resin film on the support film. A protective film was placed on the curable resin film, and a film A or B including the support film, the curable resin film, and the protective film was obtained. The thickness of the curable resin film when cured was 20 μm.

[Evaluation of Adhesiveness to Encapsulant Material]

A glass substrate having a 12-inch size (a thickness of 700 μm) was cut out into a 9 mm×9 mm size by using a blade dicer (Product Name, DAD3360, manufactured by DISCO Corporation). The protective film was peeled off from the film A or the film B, and the exposed curable resin film of the film A or B was placed on the glass substrate having a 9 mm×9 mm size, and the curable resin film and the glass substrate were attached by using a vacuum laminator (Product Name, V-130, manufactured by Nikko-Materials Co., Ltd.). The condition of the vacuum laminator was set to an upper platen temperature of 90° C., a lower platen temperature of 40° C., a pressure of 0.5 MPa, and a pressurization time of 60 seconds.

Subsequently, in a case where the attaching was ended, the curable resin film was cured in each condition by using an atmospheric oven (Product Name, PHH-202, manufactured by ESPEC CORP.) or a nitrogen oven (Product Name, CLH-21CD, manufactured by KOYO THERMO SYSTEMS CO., LTD.). An encapsulating body (the encapsulant material layer) was formed on the protective layer that is the cured curable resin film by using an encapsulant material (Product Name, CEL-400ZHF40, manufactured by Showa Denko Materials Co., Ltd.) and a molding device (Product Name, ADM-12, manufactured by MEIHO CO., LTD.). A bonding adhesive area between the encapsulating body and the protective layer was 10 mm². The condition of the molding device was set to an encapsulating temperature of 130° C. and a curing time of 600 seconds. The encapsulating body formed by using the oven was heated to 175° C. for 4 hours such that the encapsulating body was further cured. Accordingly, a laminated body for evaluation including the glass substrate, the protective layer, and the encapsulating body was obtained.

Next, a shear jig was scanned in parallel to the main surface of the glass substrate by using a bond tester (Product Name, System650, manufactured by Royce Instruments, Inc.), and a shear stress obtained by cutting off the formed encapsulating body was measured as a bonding adhesive strength between the encapsulating body and the protective layer. The bonding adhesive area between the encapsulating body and the protective layer was set to 10 mm², a manipulation rate of the shear jig was set to 50 μm/s, and clearance was set to 100 μm on the basis of the protective layer formed on the glass substrate. The results of the bonding adhesive strength in a curing condition of the protective layer of each example are shown in Table 2 and Table 3. The bonding adhesive strength to the encapsulating body shown in Table 2 and Table 3 described below indicates the average value obtained by performing a test 10 times for each example. The temperature at the time of measuring the bonding adhesive strength was a room temperature (25° C.). Note that, the bonding adhesive strength in this specification is measured by the method described above.

[Laser Peeling Test]

Next, the same film A and film B as those in the tests of Examples 1 to 8 described above were prepared, the curable resin film exposed by peeling off the protective film from the film A or the film B was placed on a glass substrate (60 mm×60 mm, a thickness of 700 μm), and the curable resin film and the glass substrate were attached by a vacuum laminator (Product Name, V-130, manufactured by Nikko-Materials Co., Ltd.). The condition of the vacuum laminator was set to an upper platen temperature of 90° C., a lower platen temperature of 40° C., a pressure of 0.5 MPa, and a pressurization time of 60 seconds. The curable resin film was cured by heating at 130° C. for 20 minutes, and then, heating at 170° C. for 2 hours using the oven. The encapsulant material layer was formed on the protective layer that is the cured curable resin film in the condition of 150° C. for 300 seconds by using an encapsulant material containing an epoxy resin and a molding device (Product Name, CPM1080, manufactured by TOWA CORPORATION). The formed encapsulant material layer was further cured by heating at 150° C. for 6 hours. Accordingly, a laminated body for evaluation having a three-layer structure, including the glass substrate, the protective layer, and the encapsulant material layer, was obtained.

TABLE 2

| Item | Example 1 | Example 2 | Example 3 | Example 4 |
|---|---|---|---|---|
| Type of protective layer | A | A | A | A |
| Curing condition of protective layer | 130° C. for 30 minutes 170° C. for 60 minutes Under atmosphere | 170° C. for 60 minutes Under atmosphere | 170° C. for 60 minutes Under nitrogen atmosphere | 200° C. for 60 minutes Under nitrogen atmosphere |
| Bonding adhesive strength to encapsulating body [MPa] | 4.9 | 6.0 | 6.9 | 7.5 |

TABLE 3

| Item | Example 5 | Example 6 | Example 7 | Example 8 |
|---|---|---|---|---|
| Type of protective layer | B | B | B | B |
| Curing condition of protective layer | 130° C. for 30 minutes 170° C. for 60 minutes Under atmosphere | 170° C. for 60 minutes Under atmosphere | 170° C. for 60 minutes Under nitrogen atmosphere | 200° C. for 60 minutes Under nitrogen atmosphere |
| Bonding adhesive strength to encapsulating body [MPa] | 25.3 | 25.4 | 24.0 | 26.0 |

As shown in Table 2 and Table 3 described above, by setting the curing condition of the protective layer to a predetermined range, it was possible to check that the cured layer to be the protective layer was capable of adhering to the encapsulant material layer at 4.0 MVPa or more. Similarly, it was possible to check that the cured layer to be the protective layer was capable of adhering to the encapsulant material layer at 20 MVPa or more.

The laminated body for evaluation was irradiated with UV laser light at a wavelength of 355 nm in a direction perpendicular to the glass substrate to peel off the glass substrate. After the irradiation, a case where the encapsulant material layer with the protective layer and the glass substrate were easily peeled off was evaluated as A, a case where the encapsulant material layer with the protective layer and the glass substrate were peeled off by making a notch with a cutter was evaluated as B, and peeling results in each irradiation condition of the UV laser light were shown in Table 4 and Table 5. Note that, by applying the laser light, there was no decrease in the bonding adhesive strength between the protective layer and the encapsulant material layer.

TABLE 4

| Item | | Example 9 | Example 10 | Example 11 | Example 12 |
|---|---|---|---|---|---|
| Type of protective layer | | A | A | A | A |
| Laser peeling test | Peeling energy [kw/cm²] | 18.5 | 46.8 | 73.9 | 100.6 |
| | Output [mW] | 58 | 147 | 232 | 316 |
| | Repetition frequency [kHz] | 76 | 65 | 59 | 55 |
| | Scanning rate [mm/s] | 760 | 650 | 590 | 550 |
| | Pitch [μm] | 9 | 9 | 9 | 9 |
| | Overlap [%] | 50 | 50 | 50 | 50 |
| | Peeling properties | B | A | A | A |

TABLE 5

| Item | | Example 13 | Example 14 | Example 15 |
|---|---|---|---|---|
| Type of protective layer | | B | B | B |
| Laser peeling test | Peeling energy [kw/cm²] | 18.5 | 100.6 | 166.6 |
| | Output [mW] | 58 | 316 | 523 |
| | Repetition frequency [kHz] | 76 | 55 | 47 |
| | Scanning rate [mm/s] | 760 | 550 | 470 |
| | Pitch [μm] | 9 | 9 | 9 |
| | Overlap [%] | 50 | 50 | 50 |
| | Peeling properties | B | B | A |

As shown in Table 4 and Table 5 described above, it was possible to check that peeling was available by setting the peeling energy when peeling off the glass substrate to be the carrier from the encapsulant material layer with the protective layer to 1 kW/cm² or more and 200 kW/cm² or less.

REFERENCE SIGNS LIST

1: semiconductor device, 10: semiconductor element, 10a: first surface, 10b: second surface, 10c: connection terminal, 20: carrier, 22: curable bonding adhesive layer, 22a: cured layer, 24, 24a: support member, 26, 26a: encapsulant material layer, 28: re-distribution layer, 30: solder ball, 32: dicing tape.

The invention claimed is:

1. A method for manufacturing a semiconductor device, comprising:

preparing a plurality of semiconductor elements each including a first surface on which a connection terminal is formed and a second surface on a side opposite to the first surface;

preparing a curable bonding adhesive layer and a carrier, wherein the curable bonding adhesive layer is formed on the carrier;

attaching the plurality of semiconductor elements to the curable bonding adhesive layer such that the second surface of each of the plurality of semiconductor elements is directed toward the curable bonding adhesive layer;

fixing the plurality of semiconductor elements to the curable bonding adhesive layer by curing the curable bonding adhesive layer;

encapsulating the plurality of semiconductor elements on the curable bonding adhesive layer with an encapsulant material after curing the curable bonding adhesive layer, so as to bond the encapsulant material to a surface of the cured curable bonding adhesive layer; and removing the carrier by irradiating with laser, wherein the carrier is removed from the cured curable bonding adhesive layer, wherein a bonding adhesive strength between the cured curable bonding adhesive layer and the encapsulant material is 4.0 MPa or more, wherein a bonding adhesive strength of the cured curable bonding adhesive layer to the carrier is 1 MPa or more in the encapsulating, and wherein a bonding adhesive strength of the cured curable bonding adhesive layer to the carrier is 5 MPa or less when the cured curable bonding adhesive layer is irradiated with the laser in the removing.

2. The method for manufacturing a semiconductor device according to claim 1, wherein the bonding adhesive strength between the cured curable bonding adhesive layer and the encapsulant material is 8.0 MPa or less.

3. The method for manufacturing a semiconductor device according to claim 1, wherein the bonding adhesive strength between the cured curable bonding adhesive layer and the encapsulant material is 20 MPa or more.

4. The method for manufacturing a semiconductor device according to claim 1, wherein a bonding adhesive strength between the cured curable bonding adhesive layer and the plurality of semiconductor elements is 4.0 MPa or more.

5. The method for manufacturing a semiconductor device according to claim 1, wherein the semiconductor device in a state in which the cured curable bonding adhesive layer protects the second surface of each of the plurality of semiconductor elements is acquired.

6. The method for manufacturing a semiconductor device according to claim 1,
wherein the carrier is a glass substrate.

7. The method for manufacturing a semiconductor device according to claim 1,
wherein the curable bonding adhesive layer includes a resin composition containing a thermoplastic resin and an epoxy curing agent, and a glass transition temperature of the thermoplastic resin is –40° C. or higher and 40° C. or lower.

8. The method for manufacturing a semiconductor device according to claim 1,
wherein a thickness of the curable bonding adhesive layer is 1 μm or more and 400 μm or less after curing.

9. The method for manufacturing a semiconductor device according to claim 1,
wherein the carrier is a glass substrate or a transparent resin substrate, and a thickness thereof is 0.1 mm or more and 2.0 mm or less.

10. The method for manufacturing a semiconductor device according to claim 1, further comprising:
grinding an encapsulant material layer encapsulating the plurality of semiconductor elements in a state in which the plurality of semiconductor elements are fixed to the curable bonding adhesive layer.

11. The method for manufacturing a semiconductor device according to claim 1, further comprising:
forming a re-distribution layer on the first surface of the plurality of semiconductor elements in a state in which the plurality of semiconductor elements are fixed to the curable bonding adhesive layer.

12. The method for manufacturing a semiconductor device according to claim 1, further comprising:
attaching a solder ball to the connection terminal of the plurality of semiconductor elements or the re-distribution layer in a state in which the plurality of semiconductor elements are fixed to the curable bonding adhesive layer.

13. The method for manufacturing a semiconductor device according to claim 1,
wherein the carrier is a light transmissive substrate, and the curable bonding adhesive layer includes a light absorbing agent, and
in the removing of the carrier, the carrier is removed by irradiating the cured curable bonding adhesive layer with laser light from the carrier side.

14. The method for manufacturing a semiconductor device according to claim 1,
wherein in the removing of the carrier, the carrier is removed by applying laser light such that peeling energy for peeling off the carrier is 1 kW/cm² or more and 200 kW/cm² or less.

15. The method for manufacturing a semiconductor device according to claim 1, further comprising:
cleaning an exposed surface of either the cured curable bonding adhesive layer or the encapsulant material layer of the encapsulant material after the removing of the carrier.

16. The method for manufacturing a semiconductor device according to claim 1, further comprising:
singulating the plurality of semiconductor elements after the removing of the carrier.

17. The method for manufacturing a semiconductor device according to claim 16,
wherein in the singulating of the plurality of semiconductor elements, the cured curable bonding adhesive layer is singulated together with the plurality of semiconductor elements, and
wherein the semiconductor device is acquired from each of the plurality of semiconductor elements in which the second surface is protected by the cured curable bonding adhesive layer.

18. The method for manufacturing a semiconductor device according to claim 1,
wherein, in the attaching of the plurality of semiconductor elements, a plurality of electronic components are attached to the curable bonding adhesive layer together with the plurality of semiconductor elements, and
wherein, in the fixing of the plurality of semiconductor elements, the plurality of electronic components are fixed to the curable bonding adhesive layer by curing the curable bonding adhesive layer.

19. The method for manufacturing a semiconductor device according to claim 11,
wherein, when the removing the carrier, the cured curable bonding adhesive layer contacts and covers:
a surface of the encapsulant material which is opposite to the re-distribution layer, and
the second surface of each of the plurality of semiconductor elements.

* * * * *